(12) United States Patent
Sypen

(10) Patent No.: US 11,444,451 B2
(45) Date of Patent: Sep. 13, 2022

(54) FAST CURRENT TRANSIENT SUPPRESSION IN A TEST SYSTEM

(71) Applicant: Keithley Instruments, LLC, Solon, OH (US)

(72) Inventor: Arthur Sypen, Newbury, OH (US)

(73) Assignee: Keithley Instruments, LLC, Solon, OH (US)

( * ) Notice: Subject to any disclaimer, the term of this patent is extended or adjusted under 35 U.S.C. 154(b) by 331 days.

(21) Appl. No.: 16/736,601

(22) Filed: Jan. 7, 2020

(65) Prior Publication Data

US 2020/0244064 A1 Jul. 30, 2020

Related U.S. Application Data

(60) Provisional application No. 62/797,327, filed on Jan. 27, 2019.

(51) Int. Cl.
*H02H 9/00* (2006.01)
*H02H 9/02* (2006.01)
*H02H 1/00* (2006.01)

(52) U.S. Cl.
CPC .......... *H02H 9/005* (2013.01); *H02H 1/0007* (2013.01); *H02H 9/02* (2013.01)

(58) Field of Classification Search
None
See application file for complete search history.

(56) References Cited

U.S. PATENT DOCUMENTS

| 6,775,112 B1* | 8/2004 | Smith | G05F 1/613 361/111 |
| 8,232,808 B2* | 7/2012 | Kimura | H03K 17/56 324/629 |
| 2006/0212745 A1* | 9/2006 | Zansky | G01R 31/3277 714/6.12 |
| 2018/0354384 A1* | 12/2018 | Lu | H01M 10/48 |

* cited by examiner

*Primary Examiner* — Stephen W Jackson
(74) *Attorney, Agent, or Firm* — Miller Nash LLP; Andrew J. Harrington

(57) ABSTRACT

A current transient suppression circuit includes an inductor electrically connected to a test signal by an input of the inductor, at least one switching device electrically connected to an output of the inductor, and an output of the at least one switching device connected to a shunt path. A method of suppressing current transients in a circuit includes receiving a test signal at an inductor, and when the test signal comprises a current transient, the current transient is received at the inductor, activating at least one switching device electrically connected to the inductor to shunt the current transient away from a device under test.

18 Claims, 6 Drawing Sheets

FAST CURRENT TRANSIENT SUPPRESSION IN A TEST SYSTEM

RELATED APPLICATIONS

This application is a continuation of, and claims priority to, U.S. Provisional Patent Application No. 62/797,327, filed Jan. 27, 2019, which is incorporated herein by reference in its entirety.

FIELD

This disclosure relates to test and measurement systems, more particularly to case current transient suppression in a test and measurement system.

BACKGROUND

A test and measurement instrument, such as a power supply, should typically possess an innate ability to output a fixed selected current compliance level. In a power supply, this may be a fixed or variable current limit. When outputting a signal to a device under test (DUT), the DUT may suddenly conduct, as is commonly the case with semiconductor device breakdown. When this occurs, stored capacitive charge or supply rail current may quickly conduct through the DUT resulting in destructive current levels through the DUT or test fixture hardware connecting the DUT to the test and measurement instrument, such as probe needles. Additionally, in some applications there may be a transient introduced at the signal source such as a lightning strike, etc. As device geometries become smaller, this is an increasing concern as the sudden thermal increases resulting from these currents rapidly damage the device.

Historically, semiconductor test equipment allowed excessive currents through a device under test, which have damaged customer devices. The customer could minimize these effects by adding series resistors in the test setup. This is somewhat effective, but undesirably eliminates the ability to do subsequent higher current tests unless one removes the resistance for these tests. Other approaches implemented a dynamic variable series resistance in series with the circuit branch between the instrument and the device under test, or other changes to the test circuit topology as mentioned above.

Conventional current transient protection circuits include a circuit commonly referred to as a "crowbar" circuit. Typically, this circuit involves a silicon-controlled rectifier that shunts a circuit branch to the associated return during a situation such as over voltage, etc. In contrast, embodiments of the disclosed technology differ in that the switching elements may be galvanically isolated to accomplish low current performance and to be able to operate at an acceptable speed to deal with fast transients. The isolation to the shunt element control pins allow the use of circuit guarding to achieve ultra-low current (e.g., picoamp and even nanoamp) performance.

Embodiments of the disclosed apparatus and methods address shortcomings in the prior art.

DETAILED DESCRIPTION

Figure 2:
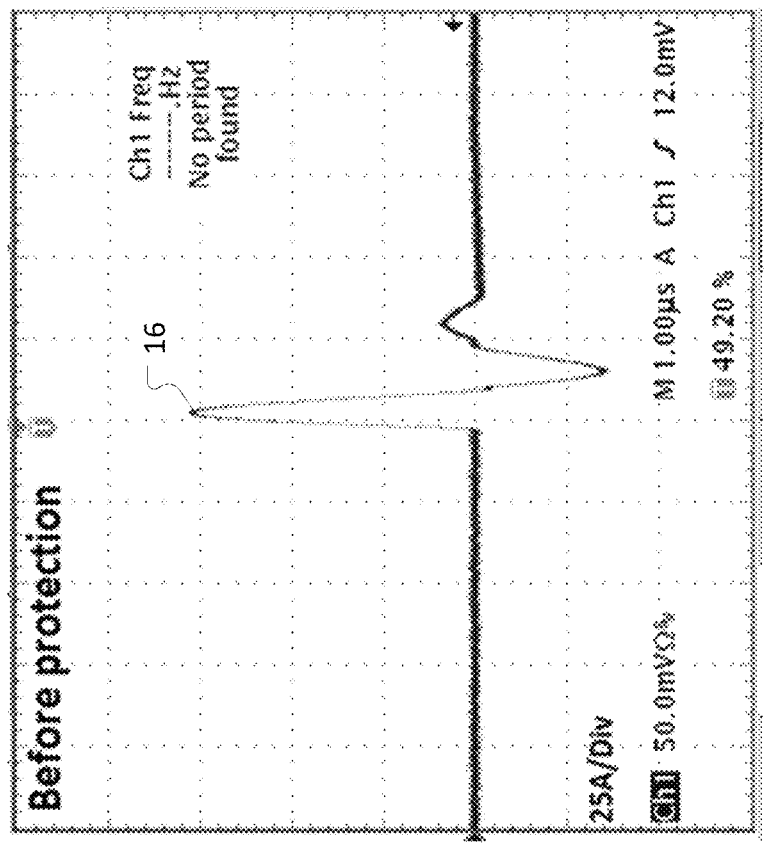
FIG. 2 shows an output waveform of current for a circuit with an unprotected load.
Figure 1:
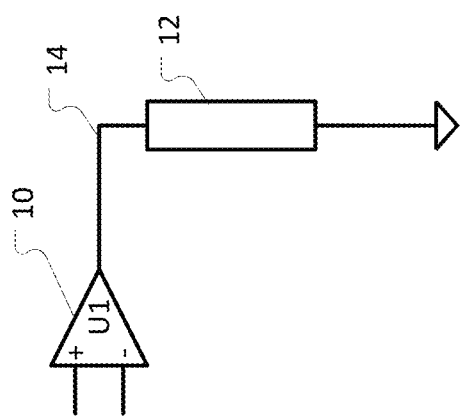
FIG. 1 shows a conventional circuit with an unprotected load.

The embodiments here generally provide a protection circuit block, referred to in some instances as current transient suppression circuit. FIG. 1 shows a conventional current source without such a protection block. In FIG. 1, the amplifier U1 10 amplifier illustrates an unprotected load 12. A transient at the amplifier 10 or a sudden breakdown to low resistance of the load most often causes high current flow in the load. The amplifier 10 and cable 14 have capacitance with a finite bandwidth to limit current effectively. FIG. 2 shows an actual oscilloscope waveform 16 of current in the U1 amplifier and load circuit of FIG. 1 showing the current through the load without the protection circuit block.

Figure 4:
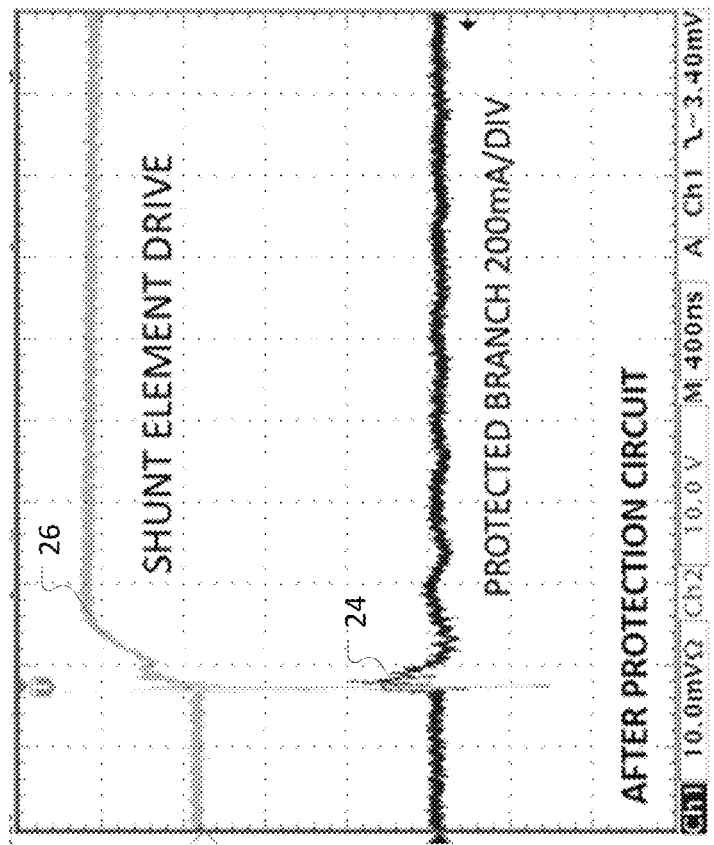
FIG. 4 shows an output current waveform for a circuit with a current transient suppression circuit.
Figure 3:
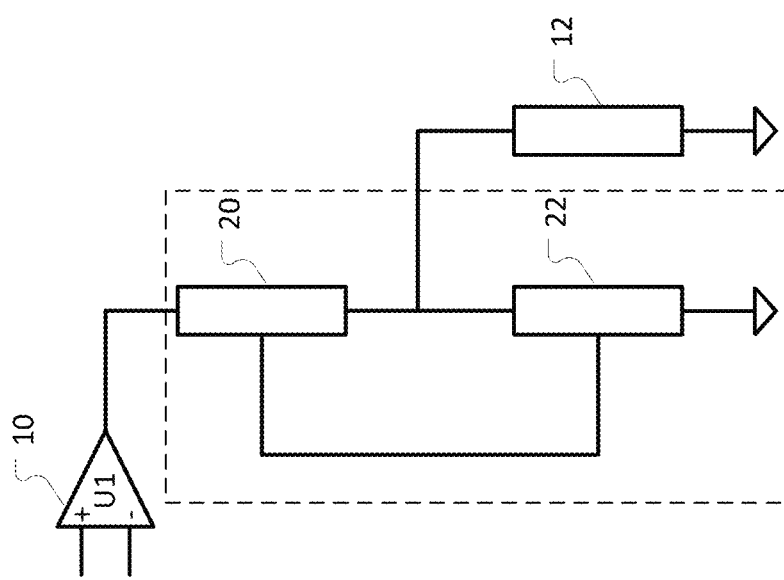
FIG. 3 shows an embodiment of a current transient suppression circuit.

When the source current provides a transient, or the load, such as a device under test, begins to conduct, the portion 20 of the circuit of FIG. 3 provides impedance and senses the increase in current. The portion 20 then shunts the current over to the path 22 to shunt the excess current to ground or elsewhere away from the load. FIG. 4 shows the current waveforms for the shunt element 26 and the protected branch, or circuit 24, when the shunt element is in place.

The embodiments here provide protection over a wide range of useful voltages, without having to reconfigure the test circuit topology. They provide a discharge path for stored charge away from the device under test. The embodiments include resistance, in the milliohms range, in series with the device under test, allowing use of higher static DC currents without detrimental voltage drops. The circuits here provide fast acting transient suppression when compared to prior art pass elements having capacitance that could pass the destructive fast transients to the device under test. In addition, the embodiments here enable topologies that may use circuit guarding for ultra-low current performance. One should note that the term "current transient" or "transient" refers to both a current transient generated by the source of the test signal, as well as current generated when the device under test suddenly starts to conduct.

FIGS. 5-8 show different implementations of a current transient suppression circuit. Generally, the current transient suppression circuit provides a series inductance to the current source and switching elements electrically connected to the series inductance to provide a path away from the path between the source and the device under test when the switches become active.

The embodiments generally introduce an inductance in series with the test signal and include switching elements, that when activated, will shunt the excess current to ground or other node away from the DUT. As used here, the term "electrically connected" means that two circuit elements or devices share a common path through the circuit, although there may be intervening circuit elements between them.

Figure 5:
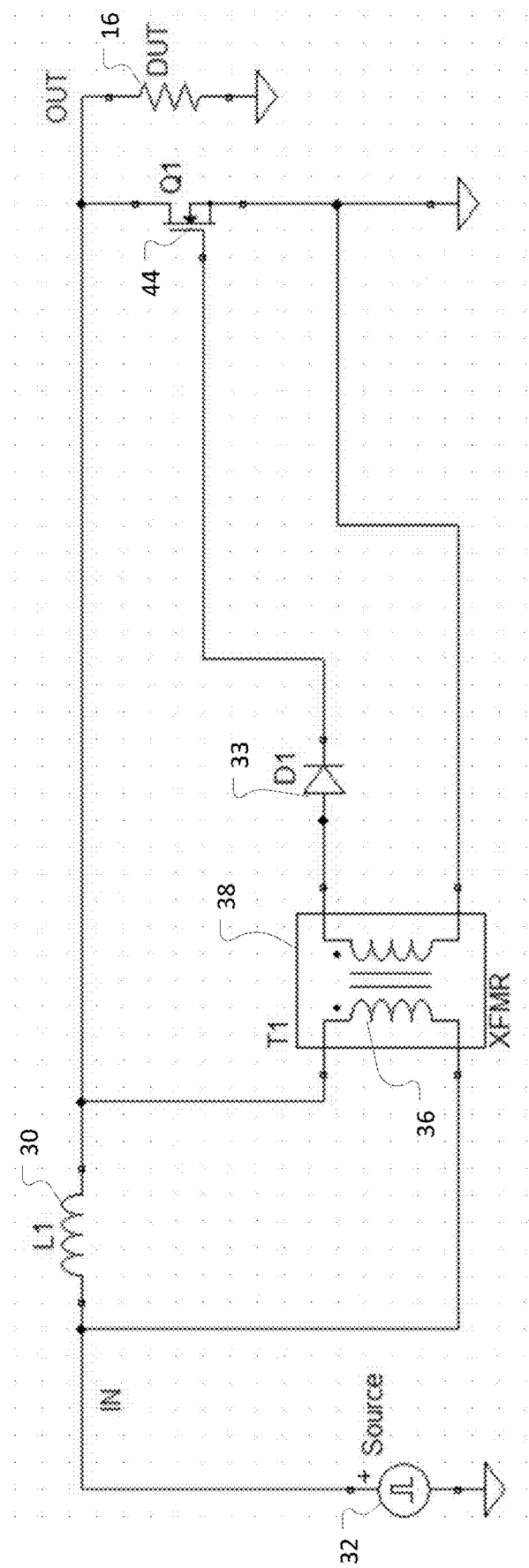
FIGS. 5-8 shows various embodiments of a current transient suppression circuit.

FIG. 5 shows an embodiment of a fast current transient suppression circuit. An inductor L1 30 lies in series with the test from the source 32. When a transient current appears at the inductor L1 10, the inductor develops a voltage drop across it. The voltage couples to the primary winding 36 of the transformer 38. In this embodiment, the inductor L1 30 exists as a stand-alone inductor separately from the transformer 38. The voltage from the transformer turns on the diode D1 33, which in turn passes the voltage to the gate of the switching device 44.

In the discussion here, for ease of understanding, the switching device or devices consist of transistors, but any type of voltage activated switching device will suffice. When the voltage reaches the gate of the switch 44, the switch turns on and shunts the excess current into a path away from the DUT 16, such as to ground. In this manner, the circuit reacts quickly to the excess current because of the inductor L1 30 and the excess current goes into a path away from the DUT 16, saving it from damage.

Figure 6:
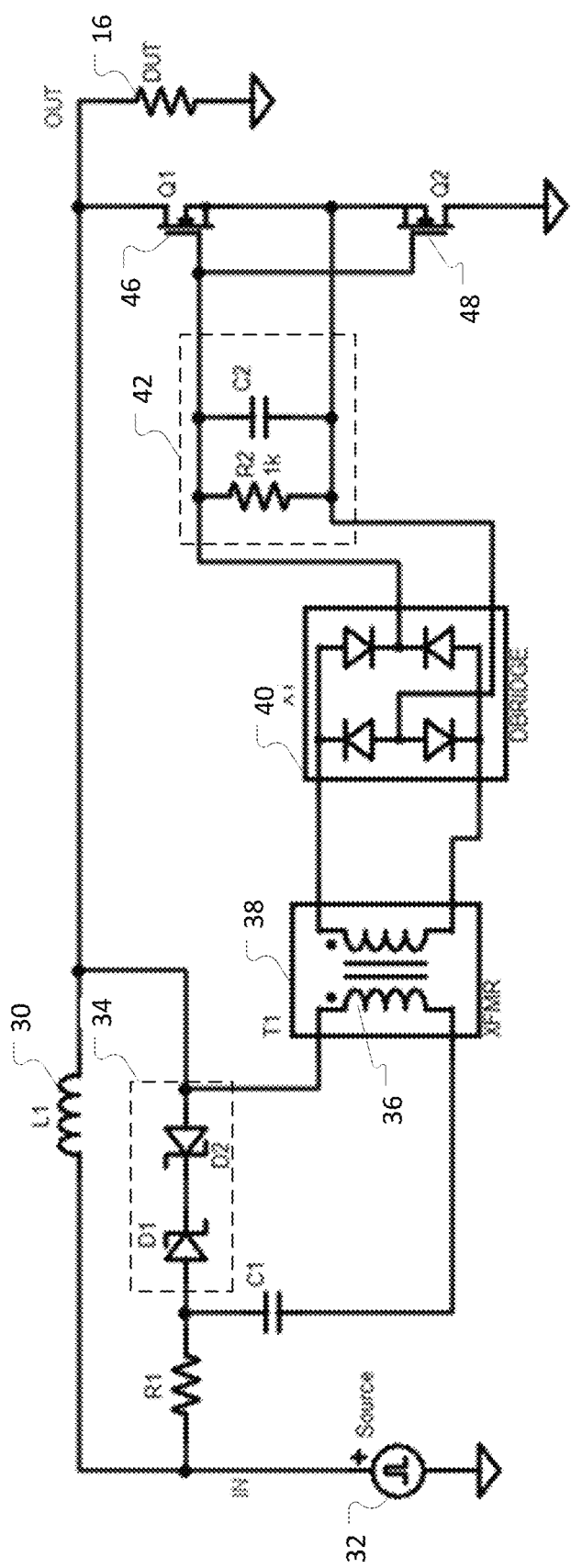

FIG. 6 shows another embodiment, in which the inductor L1 30 is in series with the test signal from the source 32. When a transient current appears at the inductor L1 30, or the DUT begins to conduct, the inductor L1 30 develops a voltage drop across it, which in turn causes a voltage to appear across the D1, D2 Zener diode bidirectional limiting combination 34. The diode bidirectional limiting combination 34 limits the voltage to the switching device or devices to protect it or them from excess voltage. Similar to the embodiment of FIG. 5, the inductor L1 30 exist separately from the transformer 38. The voltage couples to the primary winding 36 of the transformer 38.

This in turn produces a signal at the input to the bridge rectifier diode steering circuit X1 40. The bridge rectifier X1 40 provides another optional enhancement that allows for bipolar operation, if desired over unipolar operation. The outputs of the rectifier connect electrically to the R-C network 42 made up of resistor R2 and capacitor C2. The RC network controls the ON time of the switching device and the resistor R2 bleeds charge off the gate to ensure the switch is OFF when is should be OFF. Again, these provide additional enhancements and the transient current suppression circuits operates without them.

Returning to the operation of this embodiment in the presence of a transient current, regardless of the transient polarity, the output polarity of the bridge rectifier 40 will apply a positive voltage to the gates of the Q1 transistor 44 and the Q2 transistor 46. The extra switching device 46 provides the ability to shut more current away from the DUT. When the voltage from the rectifier reaches the gates of the transistors, they turn on and shunt the current from the transient to ground, or another node that is away from the DUT, represented here as a resistor 48. While this embodiment employs transistors as the switching elements, other switching elements may be used. In one embodiment, the transistors are metal-oxide semiconductor field effect transistors (MOSFETs).

Generally, in the above embodiment and all the embodiments, the faster the transient, the higher the reactance of L1, where reactance as used here means the opposition of a circuit element to a change in current (or voltage) due to its inductance. This allows the suppression circuit to react quickly to a transient current and protect the DUT from the excessive current.

Figure 7:
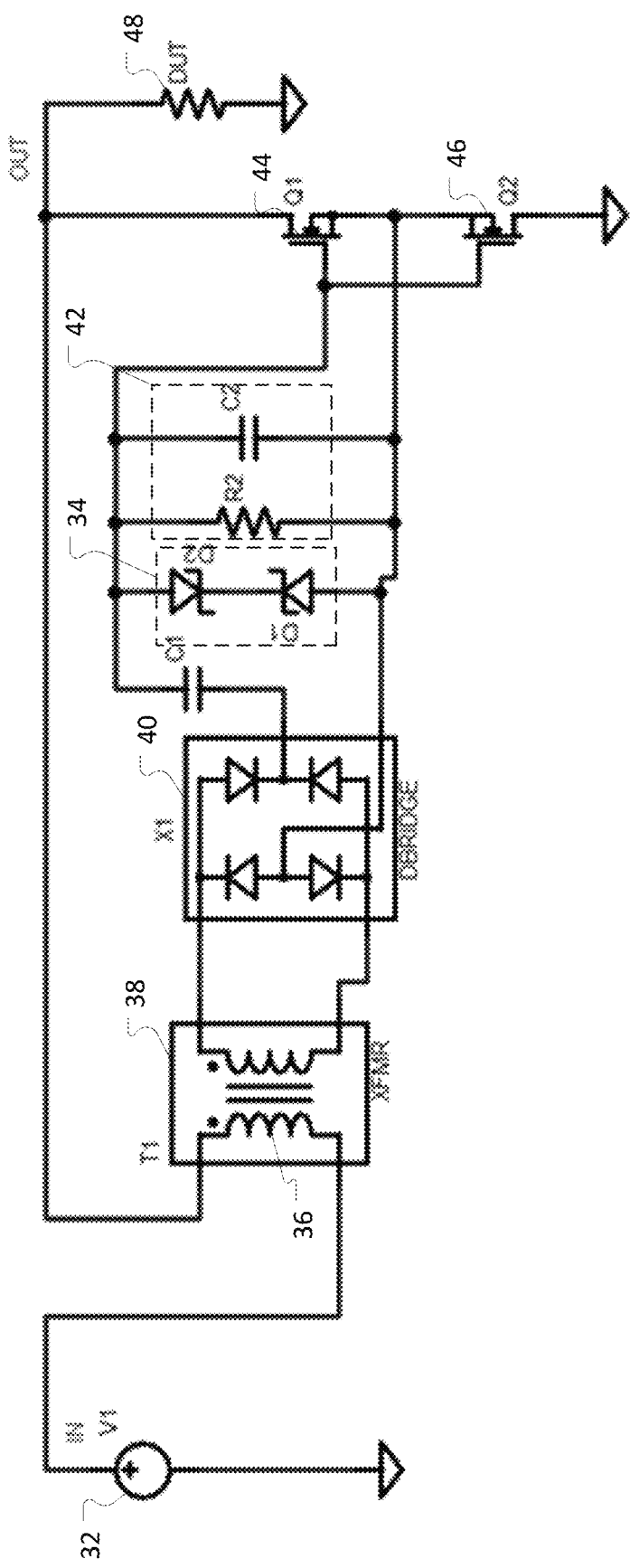
Figure 8:
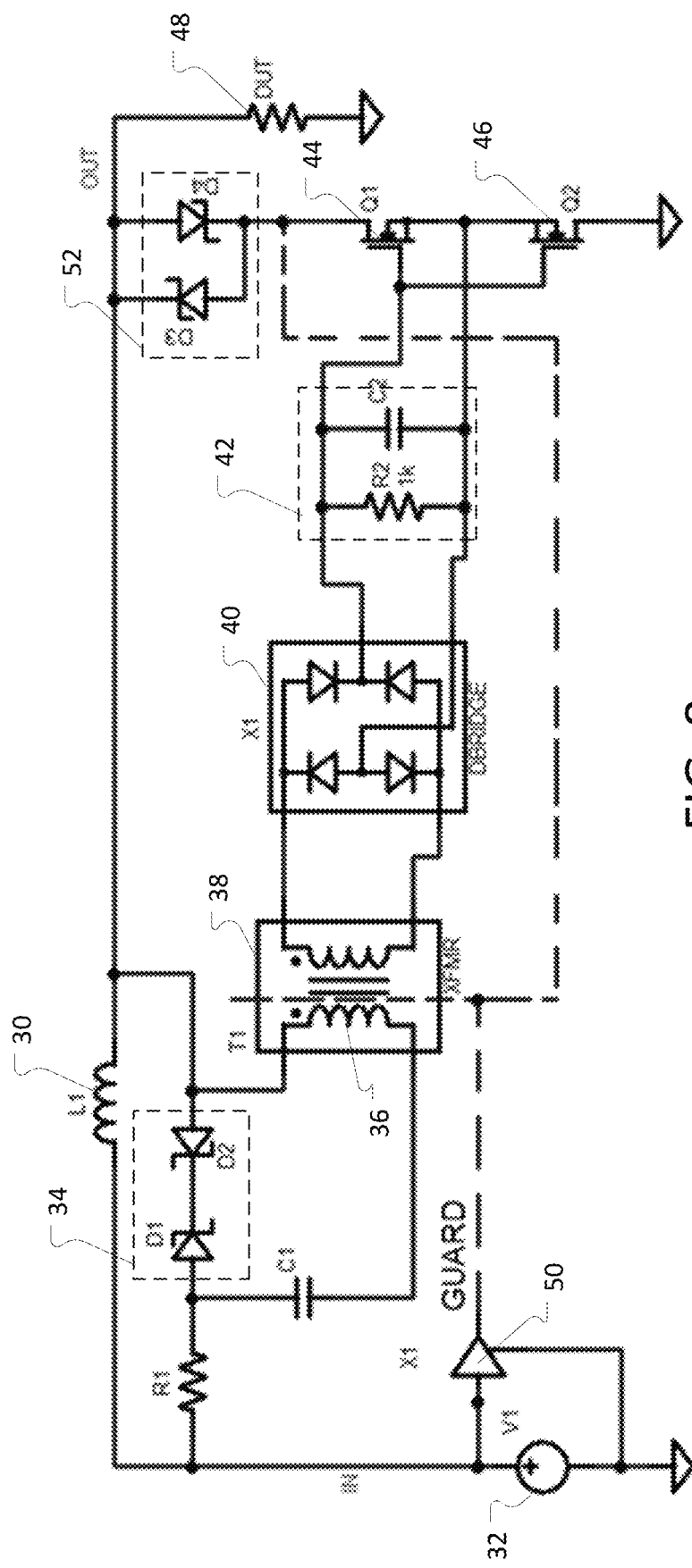

In an alternative embodiment, the inductor L1 30 of FIGS. 5 and 6 is not used and instead the primary winding 36 of the transformer 38 acts as the series inductance as shown in FIG. 7. The same process happens upon the appearance of a transient from the source 32, or if the DUT 48 begins to conduct. In this embodiment though, the voltage appears at the primary winding 38 of the transformer 38 that results in the voltage at the input of the bridge rectifier X1 40. The Zener diode bidirectional limiting combination 34 resides between the half bridge rectifier and the switching elements in this embodiment. As in the embodiment of FIGS. 5 and 6, when the resulting voltage from the bridge rectifier reaches the switching elements, they become active and shunt the current to ground or other node away from the DUT 48.

In either of the above embodiments, or in other embodiments not shown, the circuit may include a guard circuit to allow ultra-low current performance, such as in the femto-amp ($10^{-15}$) range, even when using high voltage inputs in the range of hundreds of volts. The guard circuit prevents any voltage leakage so the amperage is more precisely controllable. FIG. 7 shows an embodiment of a guard circuit. Again, even though FIG. 7 shows the guard circuit with the embodiment of FIG. 5, one should not that the guard circuit could reside in the embodiment of FIG. 6, as well as other embodiments not shown.

In the embodiment of FIG. 7, the guard circuit takes the form of a buffer 50, which in one embodiment may consist of a precision, low input, bias current buffer. The guard circuit would connect to the primary winding 36 of the transformer 38. The circuit elements remain the same as in FIG. 5, except for the addition of another diode bidirectional limiting combination 52, of diodes D3 and D4. The guard circuit would terminate in the path between the bidirectional limiting combination and the switching elements, such as Q1 44. This provides the ability for low-current performance, even with relatively high input voltages.

One should note that any or all of the additional enhancements, such as the diode bidirectional combination, the bridge rectifier, the RC network, the guard circuit, and the additional switch could be used in any combination and in any embodiment discussed here and will be considered to be within the scope of the claims.

In this disclosure, the singular forms "a," "an," and "the" include plural referents unless the context dictates otherwise. The term "or" as used here is meant to be inclusive and means either, any, several, or all of the listed items. The terms "comprises," "comprising," "includes," "including," or other variations thereof, are intended to cover a non-exclusive inclusion such that a process, method, or product that comprises a list of elements does not necessarily include only those elements, but may include other elements not expressly listed or inherent to such a process, method, article, or apparatus. Relative terms, such as "about," "approximately," "substantially," and "generally," are used to indicate a possible variation of ±10% of a stated or understood value.

The aspects of the present disclosure are susceptible to various modifications and alternative forms. Specific aspects have been shown by way of example in the drawings and are described in detail herein. However, one should note that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Additionally, this written description refers to particular features. One should understand that the disclosure in this specification includes all possible combinations of those particular features. For example, where a particular feature is disclosed in the context of a particular aspect, that feature can also be used, to the extent possible, in the context of other aspects.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid-state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. One should understand that the disclosure in this specification includes all possible combinations of those particular features. For example, where a particular feature is disclosed in the context of a particular aspect, that feature can also be used, to the extent possible, in the context of other aspects.

In addition, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the disclosed technologies are provided below. An embodiment of the technologies may include one or more, and any combination of, the examples described below.

Example 1 is a current transient suppression circuit, comprising: an inductor electrically connected to a test signal by an input of the inductor; at least one switching device electrically connected to an output of the inductor; and an output of the at least one switching device connected to a shunt path.

Example 2 is the circuit of Example 2, wherein the inductor comprises a stand-alone inductor.

Example 3 is the circuit of Example 2, further comprising a bridge rectifier electrically connected to an output of the inductor between the output of the inductor and the at least one switching device.

Example 4 is the circuit of Example 2, further comprising a resistor-capacitor network electrically connected between the bridge rectifier and the at least one switching device.

Example 5 is the circuit of Example 2, further comprising a transformer electrically connected between the output of the inductor and the bridge rectifier.

Example 6 is the circuit of Example 2, further comprising a bidirectional diode combination electrically connected between the output of the inductor and the bridge rectifier.

Example 7 is the circuit of any one of the Examples 1-6, wherein the at least one switching device comprises at least one transistor.

Example 8 is the circuit of any one of the Examples 1-7, further comprising a guard circuit between the test signal and the at least one switching device.

Example 9 is the circuit of any one of the Examples 1 and 7-8, wherein the inductor comprises a primary winding of a transformer.

Example 10 is the circuit of Example 9, further comprising a bridge rectifier electrically connected to an output of the transformer.

Example 11 is the circuit of Example 9, further comprising a bidirectional diode combination electrically connected between the bridge rectifier and the at least one switching device.

Example 12 is the circuit of Example 11, further comprising a resistor-capacitor network between the bidirectional diode combination and the switching device.

Example 13 is a method of suppressing current transients in a circuit, comprising: receiving a test signal at an inductor; and when the test signal comprises a current transient, the current transient is received at the inductor, activating at least one switching device electrically connected to the inductor to shunt the current transient away from a device under test.

Example 14 is the method of Example 13, further comprising providing a bridge rectifier electrically connected to an output of the inductor to allow bipolar operation.

Example 15 is the method of Example 13, wherein providing the bridge rectifier comprises connecting the output of the inductor to a transformer and connecting an output of the transformer to a bridge rectifier.

Example 16 is the method of Example 13, wherein the current transient comprises a transient current generated from a source of the test signal.

Example 17 is the method of Example 13, wherein the current transient comprises a current generated in response to conduction of the device under test.

Example 18 is the method of Example 13, wherein receiving the test signal at an inductor comprises receiving the test signal at a stand-alone inductor.

Example 19 is the method of Example 13, wherein receiving the test signal at an inductor comprises receiving the test signal at a primary winding of a transformer.

Example 20 is the method of Example 13, further comprising providing a guard circuit electrically connected to a source of the test signal.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A current transient suppression circuit, comprising:
   an inductor electrically connected to a test signal by an input of the inductor;
   at least one switching device electrically connected to an output of the inductor;
   an output of the at least one switching device connected to a shunt path; and
   a bridge rectifier electrically connected to an output of the inductor between the output of the inductor and the at least one switching device.

2. The circuit as claimed in claim 1, wherein the inductor comprises a stand-alone inductor.

3. The circuit as claimed in claim 1, further comprising a resistor-capacitor network electrically connected between the bridge rectifier and the at least one switching device.

4. The circuit as claimed in claim 1, further comprising a transformer electrically connected between the output of the inductor and the bridge rectifier.

5. The circuit as claimed in claim 1, further comprising a bidirectional diode combination electrically connected between the output of the inductor and the bridge rectifier.

6. The circuit as claimed in claim 1, wherein the at least one switching device comprises at least one transistor.

7. A current transient suppression circuit, comprising:
   an inductor electrically connected to a test signal by an input of the inductor;
   at least one switching device electrically connected to an output of the inductor;
   an output of the at least one switching device connected to a shunt path; and
   a guard circuit between the test signal and the at least one switching device.

8. A current transient suppression circuit, comprising:
   an inductor electrically connected to a test signal by an input of the inductor, wherein the inductor comprises a primary winding of a transformer;
   at least one switching device electrically connected to an output of the inductor; and
   an output of the at least one switching device connected to a shunt path.

9. The circuit as claimed in claim 8, further comprising a bridge rectifier electrically connected to an output of the transformer.

10. The circuit as claimed in claim 9, further comprising a bidirectional diode combination electrically connected between the bridge rectifier and the at least one switching device.

11. The circuit as claimed in claim 10, further comprising a resistor-capacitor network between the bidirectional diode combination and the switching device.

12. A method of suppressing current transients in a circuit, comprising:
   receiving a test signal at an inductor;
   when the test signal comprises a current transient, the current transient is received at the inductor, activating at least one switching device electrically connected to the inductor to shunt the current transient away from a device under test; and
   providing a bridge rectifier electrically connected to an output of the inductor to allow bipolar operation.

13. The method as claimed in claim 12, wherein providing the bridge rectifier comprises connecting the output of the inductor to a transformer and connecting an output of the transformer to a bridge rectifier.

14. The method as claimed in claim 12, wherein the current transient comprises a transient current generated from a source of the test signal.

15. The method as claimed in claim 12, wherein the current transient comprises a current generated in response to conduction of the device under test.

16. The method as claimed in claim 12, wherein receiving the test signal at an inductor comprises receiving the test signal at a stand-alone inductor.

17. The method as claimed in claim 12, wherein receiving the test signal at an inductor comprises receiving the test signal at a primary winding of a transformer.

18. A method of suppressing current transients in a circuit, comprising:
   receiving a test signal at an inductor;
   when the test signal comprises a current transient, the current transient is received at the inductor, activating at least one switching device electrically connected to the inductor to shunt the current transient away from a device under test; and
   providing a guard circuit electrically connected to a source of the test signal.

* * * * *